(12) United States Patent
Yang et al.

(10) Patent No.: US 11,217,637 B2
(45) Date of Patent: Jan. 4, 2022

(54) TOUCH DISPLAY SUBSTRATE WITH TOUCH SIGNAL LINES AND TOUCH ELECTRODES AND FABRICATION METHOD THEREOF

(71) Applicant: BOE TECHNOLOGY GROUP CO., LTD., Beijing (CN)

(72) Inventors: Shengji Yang, Beijing (CN); Xue Dong, Beijing (CN); Xiaochuan Chen, Beijing (CN); Hui Wang, Beijing (CN); Yanming Wang, Beijing (CN); Fang Yu, Beijing (CN); Wei Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 355 days.

(21) Appl. No.: 16/463,887

(22) PCT Filed: Dec. 17, 2018

(86) PCT No.: PCT/CN2018/121468
§ 371 (c)(1),
(2) Date: May 24, 2019

(87) PCT Pub. No.: WO2019/165826
PCT Pub. Date: Sep. 6, 2019

(65) Prior Publication Data
US 2021/0118957 A1 Apr. 22, 2021

(30) Foreign Application Priority Data
Feb. 27, 2018 (CN) .......................... 201810161774.0

(51) Int. Cl.
*H01L 29/207* (2006.01)
*H01L 27/32* (2006.01)
(Continued)

(52) U.S. Cl.
CPC ........ *H01L 27/323* (2013.01); *G06F 3/04164* (2019.05); *H01L 27/3246* (2013.01);
(Continued)

(58) Field of Classification Search
CPC ............... H01L 27/323; H01L 27/3246; H01L 27/3276; H01L 51/56; H01L 2227/323;
(Continued)

(56) References Cited

U.S. PATENT DOCUMENTS 8,817,216 B2    8/2014 Oh et al.
10,025,437 B2   7/2018 Cho et al.
(Continued)

FOREIGN PATENT DOCUMENTS

CN    102411237 A    4/2012
CN    107092399 A    8/2017
(Continued)

OTHER PUBLICATIONS

International Search Report dated Mar. 25, 3019, issued in counterpart Application No. PCT/CN2018/121468 (11 pages).
(Continued)

*Primary Examiner* — Caleb E Henry
(74) *Attorney, Agent, or Firm* — Westerman, Hattori, Daniels & Adrian, LLP (57) ABSTRACT

The present disclosure is related to a display substrate. The display substrate having a display area comprises a first electrode layer on a base substrate; a second electrode layer on a side of the first electrode layer far away from the base substrate; a light emitting layer between the first electrode layer and the second electrode layer; a pixel definition layer defining a plurality of sub-pixel regions with each of the plurality of sub-pixel regions containing the light emitting layer and the first electrode layer; and a signal line coupled to the second electrode layer. The signal line is substantially (Continued)

within the display area and at a different layer from the second electrode layer.

19 Claims, 9 Drawing Sheets

(51) Int. Cl.
  *G06F 3/041* (2006.01)
  *H01L 51/56* (2006.01)
(52) U.S. Cl.
  CPC .......... *H01L 27/3276* (2013.01); *H01L 51/56* (2013.01); *G06F 2203/04103* (2013.01); *H01L 2227/323* (2013.01)
(58) Field of Classification Search
  CPC ............... H01L 27/124; G06F 3/04164; G06F 2203/04103; G06F 3/0443; G06F 3/0412
  See application file for complete search history.

(56) References Cited

U.S. PATENT DOCUMENTS

| | | | | |
|---|---|---|---|---|
| 2006/0017371 | A1* | 1/2006 | Yamada | H01L 51/0005 313/498 |
| 2011/0248247 | A1* | 10/2011 | Matsumoto | H05B 33/14 257/40 |
| 2012/0112173 | A1* | 5/2012 | Matsumoto | H01L 51/5012 257/40 |
| 2015/0207100 | A1* | 7/2015 | Saito | H01L 51/524 257/40 |
| 2016/0087021 | A1* | 3/2016 | Sato | H01L 27/3262 257/43 |
| 2016/0216800 | A1 | 7/2016 | Cho et al. | |
| 2018/0011579 | A1 | 1/2018 | Shin et al. | |
| 2018/0151637 | A1* | 5/2018 | Kajiyama | H01L 27/3218 |
| 2018/0292932 | A1 | 10/2018 | Cho et al. | |

FOREIGN PATENT DOCUMENTS

| | | |
|---|---|---|
| CN | 107704129 A | 2/2018 |
| CN | 108364988 A | 8/2018 |
| KR | 20160092590 A | 8/2016 |

OTHER PUBLICATIONS

Office Action dated May 7, 2019, issued in counterpart CN Application No. 201810161774.0, with English translation (21 pages).
Office Action dated Nov. 5, 2019, issued in counterpart CN Application No. 201810161774.0, with English translation (22 pages).
Office Action dated Jan. 22, 2020, issued in counterpart CN Application No. 201810161774.0, with English Translation. (17 pages).

* cited by examiner

TOUCH DISPLAY SUBSTRATE WITH TOUCH SIGNAL LINES AND TOUCH ELECTRODES AND FABRICATION METHOD THEREOF

CROSS-REFERENCE TO RELATED APPLICATIONS

This application claims benefit of the filing date of Chinese Patent Application No. 201810161774.0 filed on Feb. 27, 2018, the disclosure of which is hereby incorporated in its entirety by reference.

TECHNICAL FIELD

This disclosure relates to display technology, in particular, to a touch display substrate, a fabrication method hereof and a display apparatus.

BACKGROUND

With the rapid progress of display technology, the organic light emitting diode (OLED), a core semiconductor component of a display apparatus, has also progressed significantly. The OLED has been widely used in the field of high-performance display as a current-type light-emitting apparatus due to its advantages over existing display apparatuses such as self-generating light, rapid response, wide visual angle, and feasibility of being manufactured on a flexible substrate.

With the development of portable electronic display equipment, a touch display apparatus provides a novel human-computer interaction interface, which makes the apparatus more direct and more humanized in use. At present, during fabrication of an OLED touch display apparatus, first, an OLED display screen and a touch screen are fabricated separately. Then, the OLED display screen and the touch screen are combined. The OLED touch display apparatus generally includes an OLED substrate, an OLED cover plate, a touch screen substrate, and a touch screen cover plate. However, this technology has shortcomings such as low light transmittance, large thickness of display apparatuses, and the like.

BRIEF SUMMARY

Accordingly, one example of the present disclosure is a display substrate having a display area comprising a first electrode layer on a base substrate, a second electrode layer on a side of the first electrode layer far away from the base substrate, a light emitting layer between the first electrode layer and the second electrode layer, a pixel definition layer defining a plurality of sub-pixel regions with each of the plurality of sub-pixel regions containing the light emitting layer and the first electrode layer, and a signal line coupled to the second electrode layer. The signal line is substantially within the display area and at a different layer from the second electrode layer.

Optionally, the display substrate further comprises a conductive connection line in the display area, wherein the signal line is coupled to the second electrode layer through the conductive connection line.

Optionally, the pixel definition layer comprises a support component and a retaining wall, the support component comprises a first through hole, and the retaining wall comprises a second through hole.

Optionally, a thickness of the support component is equal to or larger than a maximum thickness of the retaining wall.

Optionally, the display substrate further comprises a planarization layer between the base substrate and the pixel definition layer, wherein the planarization layer comprises a third through hole, the third through hole being connected to the first through hole.

Optionally, the conductive connection line comprises a first conductive connection line, a second conductive connection line, and a third conductive connection line; the first conductive connection line is within the first through hole; the second conductive connection line is on the support component and contacts with the first conductive connection line; and the third conductive connection line is within the third through hole. The second conductive connection line is coupled to the signal line through the first conductive connection line and the third conductive connection line.

Optionally, a fourth through hole is formed in at least one of the light emitting layer or the second electrode layer, the fourth through hole being connected to the second through hole to expose a surface of the second conductive connection line away from the base substrate, and the conductive connection line further comprises a fourth conductive connection line within the fourth through hole and the second through hole, and the second electrode layer couples with the second conductive connection line through the fourth conductive connection line.

Optionally, the second electrode layer comprises a plurality of mutually spaced apart touch electrodes; the display substrate comprises a plurality of signal lines and a plurality of conductive connection lines, and the plurality of signal lines are respectively coupled to the corresponding touch electrodes through the plurality of conductive connection lines in the display area.

Optionally, the second electrode layer is a cathode layer and the first electrode layer is an anode layer.

Optionally, the signal line is completely within the display area.

One example of the present disclosure is a method of fabricating a display substrate having a display area. The method comprises forming a signal line substantially or completely within the display area on the base substrate; forming a pixel definition layer defining a plurality of sub-pixel regions; forming a first electrode layer in the plurality of sub-pixels region; forming a light emitting layer on the first electrode layer and forming a second electrode layer on the light emitting layer. The second electrode layer is coupled to the signal line.

Optionally, between forming the signal line and forming the pixel definition layer, the method further comprises forming a planarization layer covering the signal line between the base substrate and the pixel definition layer.

Optionally, forming the pixel definition layer comprises forming a support component on the planarization layer, forming a first through hole in the support component and a third through hole in the planarization layer; the first through hole being connected with the third through hole; and forming a first conductive connection line and a third conductive connection line in the first through hole and the third through hole respectively.

Optionally, forming the pixel definition layer further comprises forming a second conductive connection line on the support component; the second conductive connection line being connected with the first conductive connection line.

Optionally, forming the pixel definition layer further comprises forming a retaining wall on the support component; forming a second through hole in the retaining wall, the second through hole exposing the underlying second conductive connection line; and applying a shielding component on the retaining wall to shield the second through hole. The second conductive connection line is coupled to the signal line through the first conductive connection line and the third conductive connection line.

Optionally, the method, after forming the second electrode layer, further comprises removing the shielding component to form a fourth through hole in at least one of the light emitting layer or the second electrode layer, the fourth through hole being connected with the second through hole to expose a surface of the underlying second conductive connection line; and forming the fourth connection line in the fourth through hole and the second through hole. The second electrode layer is coupled to the signal line through the fourth conductive connection line, the second conductive connection line, the first conductive connection line, and the third conductive connection line.

Optionally, applying the shielding component to shield the second through hole comprises moving the shielding component with a rail-rotating apparatus to shield the second through hole.

Optionally, the shielding component comprises a metal blocking strip having a grid structure.

One example of the present disclosure is a display panel, comprising the display substrate according to one embodiment of the present disclosure.

One example of the present disclosure is a display apparatus, comprising the display panel according to one embodiment of the present disclosure.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the are apparent from the following detailed description taken in conjunction with the accompanying drawings in which:

DETAILED DESCRIPTION

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-9. When referring to the figures, like structures and elements shown throughout are indicated with like reference numerals.

In the description of the present disclosure, the meaning of "plural" is two or more unless otherwise in some embodiments defined.

In the description of the specification, references made to the term "one embodiment," "some example embodiments," and "exemplary embodiments," "example," and "specific example," or "some examples" and the like are intended to refer that specific features and structures, materials or characteristics described in connection with the embodiment or example that are included in at least one embodiment or example of the present disclosure. The schematic expression of the terms does not necessarily refer to the same embodiment or example. Moreover, the specific features, structures, materials or characteristics described may be included in any suitable manner in any one or more embodiments or examples.

A numerical range modified by "approximately" herein means that the upper and lower limits of the numerical range can vary by 10% thereof. A number modified by "approximately" herein means that the number can vary by 10% thereof.

An overlapping range modified by "substantially" herein means that the upper and lower limits of the overlapping range can vary by 10% thereof.

Figure 1:
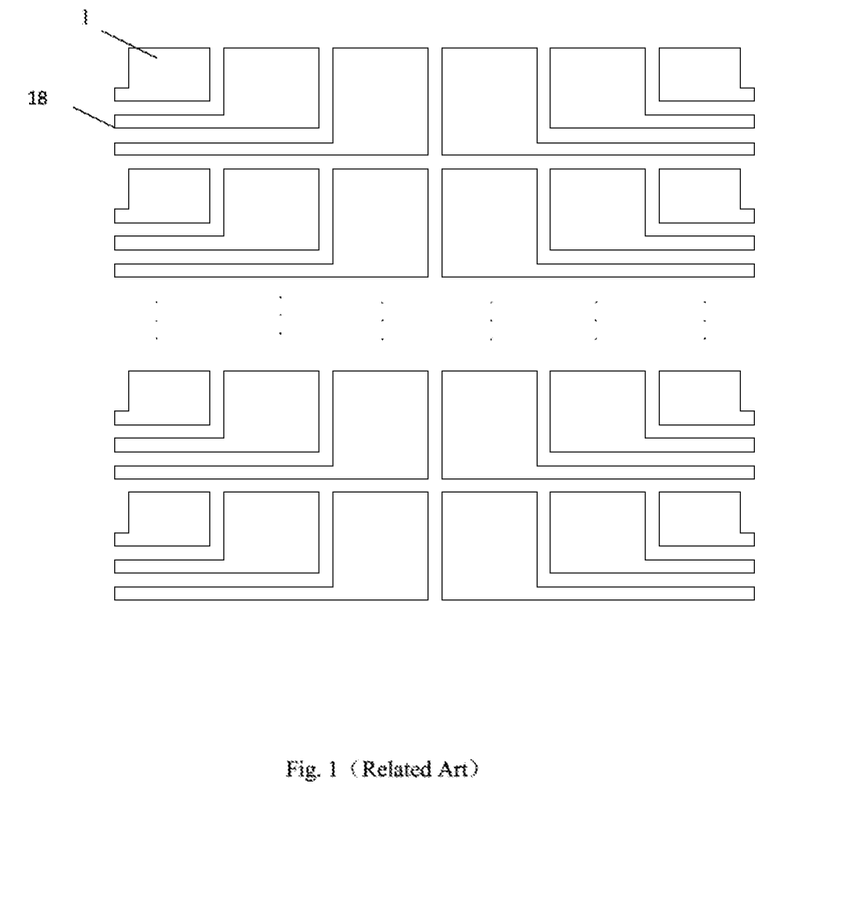
FIG. 1 is a schematic diagram of touch signal lines and touch electrodes of an existing touch display substrate.

In the related art, in order to reduce the thickness of the OLED touch display apparatus, the cathodes of the OLED touch display apparatus are commonly used as the touch electrodes. However, since it is not easy to form through holes penetrating a common layer, as shown in FIG. 1, the touch electrodes 1 are extended to the periphery of a display area through wires 18. Then, the wires are coupled touch signal lines below the common layer via through holes located in the periphery of the display area. As such, a peripheral wiring area needs to be reserved at the periphery of the display area. However, as the size of the touch display apparatus increases, the number of the touch electrodes and the peripheral wiring area also increase. Accordingly, a large blind touch area is formed in the periphery of the display area, which is not conducive to realization of narrow frame of the OLED touch display apparatus.

In order to at least partially solve the problem mentioned above, a touch display substrate, a fabrication method thereof, and a display apparatus are provided according to some embodiments of the present disclosure, which can realize narrow frame and large size of an embedded touch display apparatus.

A method of fabricating a touch display substrate is provided according to some embodiments of the present disclosure. The method includes steps of forming a plurality of anodes, a common layer and a plurality of touch electrodes on a base substrate in sequence. The method of fabricating a touch display substrate further includes the followings:

A plurality of touch signal lines and a plurality of conductive connection lines are respectively formed in the display area of the touch display substrate. The touch signal lines correspond to the touch electrodes in a one-to-one mode. A touch signal line is electrically coupled to a corresponding touch electrode through a conductive connection line.

Figure 2:
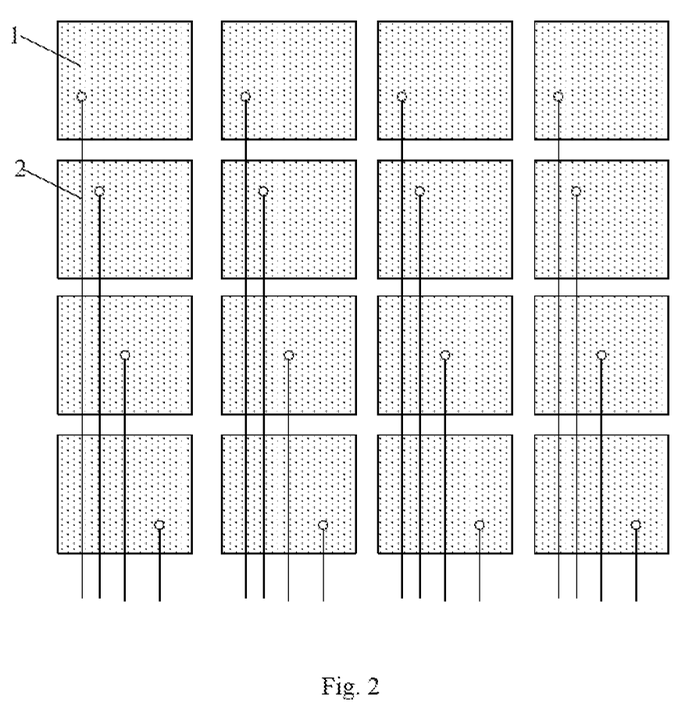
FIG. 2 is a schematic diagram of touch signal lines and touch electrodes of a touch display substrate according to some embodiments of the present disclosure.

In the touch display substrate according to the embodiments of the present disclosure, as shown in FIG. 2, each of the touch electrodes 1 is coupled to a touch signal line 2 in the display area through a conductive connection line in the display area. As such, a uniform design of touch electrodes can be ensured, thereby effectively improving touch precision. Meanwhile, a peripheral wiring area does not need to be reserved at the peripheral of the display area, thereby facilitating realization of narrow frame and large size of the touch display apparatus.

Furthermore, in some embodiments, the touch display substrate includes a thin film transistor array layer. In some embodiments, a conductive pattern of the thin film transistor array layer and a plurality of touch signal lines are formed through one patterning process. As such, the touch signal lines are formed while the number of the patterning processes is not increased, thereby reducing the number of patterning processes and cost of the touch display substrate.

In some embodiments, after the thin film transistor array layer is formed, the touch signal lines are formed above the thin film transistor array layer.

That is, the steps of forming touch signal lines may include forming the conductive pattern of the thin film transistor array layer and the control signal lines through one patterning process or forming the touch signal lines above the thin film transistor array layer ater the thin film transistor array layer is formed.

The conductive pattern of the thin film transistor array layer may include a metal pattern of gate electrodes and a metal pattern of source electrodes and drain electrodes. The metal pattern of gate electrodes and the control signal lines can be formed through one patterning process. Alternatively, the mew pattern of the source electrodes and drain electrodes and the touch signal lines can be formed by one patterning process. In some embodiments, an extension direction of the touch signal lines is the same as that of the data lines of the touch display substrate, and the metal pattern of the source electrodes and drain electrodes and the touch signal lines are formed through one patterning process.

Figure 3:
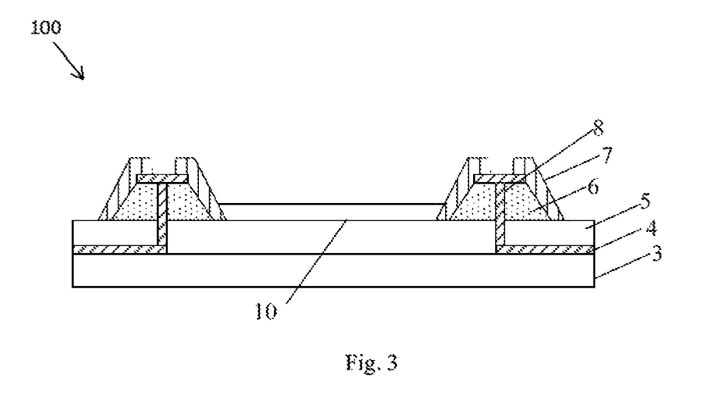
FIGS. 3-6 show schematic flow diagrams of a method of fabricating a touch display substrate according to some embodiments of the present disclosure.

In some embodiments, as shown in FIG. 3, forming the conductive connection lines includes forming a planarization layer covering the touch signal lines, forming a plurality of anodes and a plurality of supporting components located between adjacent anodes on the planarization layer, forming first through holes penetrating through the supporting components and third through boles penetrating the planarization layer, the first through holes and the third through holes exposing the touch signal lines, and forming the conductive connection lines coupled to the touch signal lines respectively through the first through holes and the third through holes.

According to the embodiments of the present disclosure, after the anodes and the supporting components between adjacent anodes are formed, the first through holes penetrating through the supporting components and the third through holes penetrating through the planarization layer are formed. Since the supporting components are located between the adjacent anodes, the first through holes and the third through holes do not need to penetrate through the anodes, thereby not impacting the display of the touch display substrate. Since the first through holes and the third through holes expose the touch signal lines, the conductive connection lines can be formed through the first through holes and the third through holes to couple to the touch signal lines respectively.

Since a pixel defining layer located between adjacent anodes includes a support component and a retaining wall, the support components overlap the retaining wall. The height of the pixel defining layer is relatively high. When the retaining wall is subsequently patterned to form second through holes exposing the conductive connection lines, in order to prevent depth of the second through holes from being too large, the conductive connection lines are formed on the supporting components having a certain height. As such, the depth of the second through holes can be reduced, thereby facilitating optimization of connection of the conductive connection lines and the touch electrodes.

Figure 4:
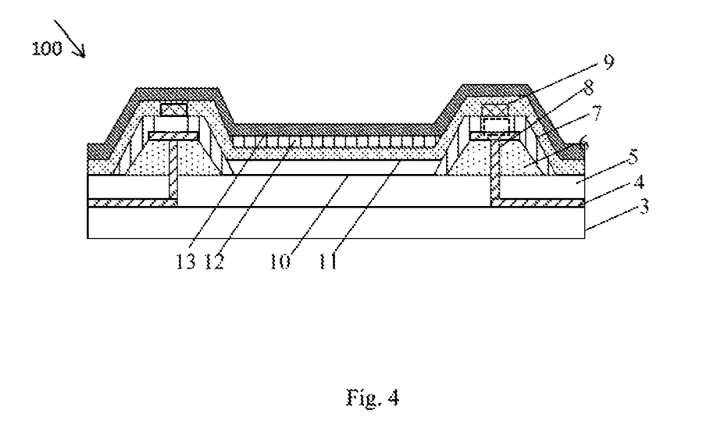

Furthermore, as shown in FIG. 4, forming the common layer includes forming the pixel defining layer covering the conductive connection lines, forming the second through holes exposing the conductive connection lines through patterning of the pixel defining layer, shielding the second through holes using a shielding component, and vapor depositing material of the common layer.

Figure 5:
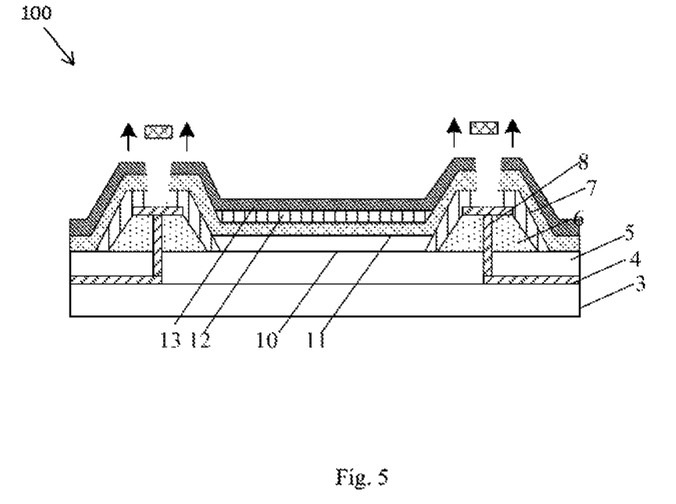

Furthermore, after vapor deposition of the material of the common layer is completed, as shown in FIG. 5, the shielding component is removed. Accordingly, the formed common layer includes the fourth through holes corresponding to the second through holes. That is, the fourth through holes are connected to the second through holes.

In the embodiments, the retaining wall 7 is patterned to form the second through holes exposing the conductive connection lines 8. Then, a shielding component 9 is used to shield the second through holes. The material of the common layer is vapor deposited. Because of the shielding component 9, the material of the common layer is not vapor deposited inside the second through holes. As such, after the vapor deposition of the material of the common layer is completed and the shielding component 9 is removed, a common layer including the fourth through hole is formed naturally, thereby fabricating the fourth through hole penetrating through the common layer. The common layer includes at least one of the emitting layer, a hole transmission layer, a hole injection layer, an electron transmission layer, or an electron injection layer, or a cathode layer. In some embodiments, the fourth hole may be formed penetrating one layer. In some embodiments, the fourth hole is formed to penetrate one layer of the common layer. In some embodiments, the fourth hole is formed to penetrate two or more layers of the common layer.

In some embodiments, forming the touch electrodes includes forming a plurality of touch electrodes on the base substrate having the fourth through holes. The touch electrodes are coupled to the signal line 4 through the fourth through holes, the second through holes, the first through holes, and the third through holes, thereby realizing electric connection with the touch signal lines. In some embodiments, before forming the touch electrodes, the fourth through holes are formed in at least one of the emitting layer, a hole transmission layer, a hole injection layer, an electron transmission layer, or an electron injection layer. Forming the touch electrodes includes forming connection lines in the fourth through holes to couple the touch electrodes with the signal lines.

In some embodiments, before forming the touch electrodes on the base substrate having the fourth through holes, a layer of negative photoresist is formed and exposed on the base substrate. Because the negative photoresist has the characteristic that the exposed part is maintained, a plurality of isolation spacers having an inverted-table shape are formed after developing.

In some embodiments, forming the touch electrodes includes vapor depositing a layer of a cathode material on the whole surface of the base substrate. The part of the cathode material formed on the isolation spacers is separated from other parts of the cathode material. The cathode material is naturally broken at the edges of the isolation spacers to form a plurality of sub-cathodes 14 which are insulated from each other. The sub-cathodes 14 are commonly used as the touch electrodes, thereby forming an embedded touch display apparatus. Furthermore, the structure of the touch display apparatus is simplified.

Figure 7:
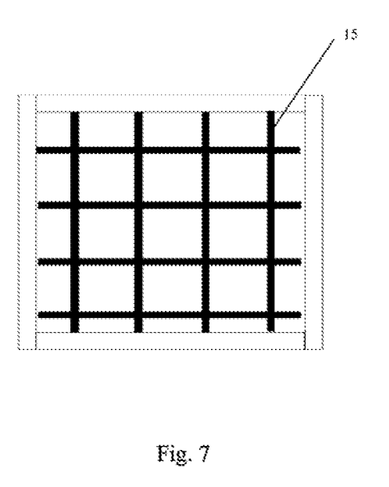
FIG. 7 is a schematic top view of a shielding component according to some embodiments of the present disclosure.
Figure 8:
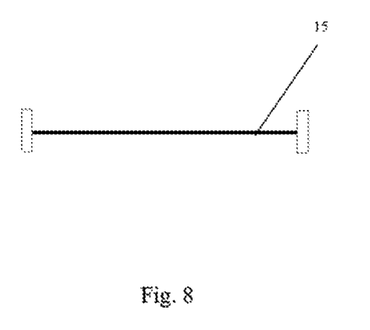
FIG. 8 is a schematic side view of a shielding component according to some embodiments of the present disclosure.

In some embodiments, the shielding component includes metal blocking strips of a grid structure, as shown in FIG. 7. FIG. 8 shows a side view of the shielding component of FIG. 7. When the material of the common layer is vapor deposited, the metal blocking strips are moved above the base substrate, and the positions of the metal blocking strips correspond to those of the second through holes so that the metal blocking strips can completely shield the second through holes. As such, when the material of the common layer is vapor deposited, the material of the common layer is not vapor deposited inside the second through holes.

The method of fabricating a touch display substrate of the present disclosure is described in detail below with reference to the accompanying drawings and specific embodiments. The method of fabricating a touch display substrate according to the embodiments includes the following steps:

In step 1, a base substrate 3 is provided. A thin film transistor array layer and touch signal lines 4 are formed on the base substrate.

The base substrate may be a glass substrate or a quartz substrate.

In some embodiments, a buffer layer is deposited on the base substrate by Plasma Enhanced Chemical Vapor Deposition (PECVD). In some embodiments, the buffer layer is made of $SiN_x$ with a thickness ranging from approximately 930 Å to approximately 1070 Å or $SiO_2$ with a thickness ranging from approximately 2790 Å to approximately 3210 Å.

A layer of semiconductor material is deposited on the buffer layer to serve as an active layer of the thin film transistors. In some embodiments, the layer of the semiconductor material can adopt p-Si with a thickness ranging from approximately 475 Å to approximately 525 Å. The layer of semiconductor material is patterned to form the active layers of the thin film transistors.

In some embodiments, a gate insulation layer is deposited on the base substrate formed with the active layers by plasma enhanced chemical vapor deposition. In some embodiments, the gate insulation layer is made of $SiO_2$ with a thickness ranging from approximately 744 Å to approximately 856 Å or SiNx with a thickness ranging from approximately 372 Å to approximately 428 Å.

A first metal layer of the gate electrodes is deposited on the gate insulation layer by a method of sputtering or thermal evaporation. In some embodiments, the first metal layer of gate electrodes is made of a material such as Cu, Al, Ag, Mo, Cr, Nd, Ni, Mn, Ti, Ta, W, or other metals or alloys of the metals thereof. The first metal layer of gate electrodes can be of a single-layer structure or a multi-layer structure. In some embodiments, the multi-layer structure is made of a material such as Cu\Mo, Ti\Cu\Ti, Mo\Al\Mo and the like. In one embodiment, Mo with a thickness of 2400 Å is used as the first metal layer of gate electrodes. The first metal layer of gate electrodes is then patterned to form a pattern of the first metal layer of gate electrodes.

In some embodiments, a dielectric layer of a storage capacitor is deposited on the base substrate having the pattern of the first metal layer of gate electrodes by plasma enhanced chemical vapor deposition. In one embodiment, the dielectric layer is made of $SiN_x$.

In some embodiments, a second metal layer of gate electrodes is deposited on the based substrate having the dielectric layer by a method of sputtering or thermal evaporation. In some embodiments, the second metal layer of gate electrodes is made of a material such as Cu, Al, Ag, Mo, Cr, Nd, Ni, Mn, Ti, Ta, W, or other metals or alloys of the metals thereof. The second metal layer of gate electrodes can be of a single-layer structure or a multi-layer structure. In some embodiments, the multi-layer structure is made of materials such as Cu\Mo, Ti\Cu\Ti, Mo\Al\Mo or the like. In one embodiment, Mo is used as the material of the second metal layer of gate electrodes. The second metal layer of gate electrodes is patterned to form a pattern of the second metal layer of gate electrodes.

In some embodiments, an interlayer insulation layer is deposited on the base substrate having the pattern of the second metal layer of gate electrodes by plasma enhanced chemical vapor deposition. In some embodiments, the interlayer insulation layer can be made of $SiO_2$ with a thickness ranging from approximately 2790 Å to approximately 3210 Å or be made of $SiN_x$ with a thickness ranging from approximately 1860 Å to approximately 2140 Å.

In some embodiments, a metal layer of source electrodes and drain electrodes is deposited on the interlayer insulating layer by a method of magnetron sputtering, thermal evaporation or other film forming method. In some embodiments, the metal layer of source electrodes and drain electrodes may be made of material such as Cu, Al, Ag, Mo, Cr, Nd, Ni, Mn, Ti, Ta, W, or other metals or alloys of the metals thereof. The metal layer of source electrodes and drain electrodes may be of a single-layer structure or a multi-layer structure. In some embodiments, the multi-layer structure may be Cu\Mo, Ti\Cu\Ti, Mo\Al\Mo or the like. In one embodiment, in order to reduce the electrical resistivity of the metal layer of source electrodes and drain electrodes, the metal layer of source electrodes and drain electrodes adopts a three-layer structure of Ti\Al\Ti, wherein the thicknesses of the three layers are approximately 300 Å/4000 Å/500 Å respectively. By patterning the metal layer of source electrodes and drain electrodes, a pattern of a metal layer of source electrodes and drain electrodes and touch signal lines are formed. Since the touch signal lines and the pattern of the metal layer of source electrodes and drain electrodes are simultaneously formed through one patterning process, the number of patterning processes of the touch display substrate is reduced, thereby reducing the cost of the touch display substrate.

In step 2, a planarization layer 5 covering the thin film transistor array layer and the touch signal lines 4 is formed.

As shown in FIG. 3, the planarization layer 5 is deposited on the substrate 3 formed with the thin film transistor array layer (not shown in the figure) and the touch signal lines 4. In some embodiments, the planarization layer 5 is made of polyimide or a photoresist. In one embodiment, the thickness of the planarization layer 5 is approximately 20000 Å.

In step 3, a plurality of anodes 10 and a plurality of supporting components 6 between adjacent anodes are formed on the planarization layer 5. A plurality of first through holes 21 penetrating through the supporting components 6 and third through holes 23 in the planarization layer 5 is formed. In addition, a plurality of first conductive connection lines 8 is formed in the plurality of first through holes respectively. A plurality of third conductive connection lines 31 are formed in the plurality of third through holes 23 respectively. The first conductive connection lines 8 are coupled to the plurality of touch signal lines 4 through the third conductive connection lines 31.

As shown in FIG. 3, a transparent conductive material is deposited on the planarization layer. In some embodiments, in order to reduce the resistivity of the transparent conducting material, the transparent conducting material is made of material such as ITO\Ag\ITO, wherein the thicknesses of the three layers are approximately 70 Å\1000 Å\70 Å respectively. The transparent conductive material is patterned to form the plurality of anodes 10 of the touch display substrate.

A layer of insulation material is deposited on the base substrate formed with the anodes 10. The layer of insulation material is patterned to form the supporting components 6 located between the adjacent anodes 10. In addition, the supporting components 6 are formed with first through holes respectively. Moreover, the touch signal lines 4 are exposed by the first through holes and the third through holes.

A layer of conductive material is deposited on the base substrate having the supporting components 6. In one embodiment, in order to reduce the electrical resistivity of the conductive material, the layer of the conductive material is made of material such as Ti\Al\Ti. The thicknesses of the three layers are approximately 300 Å/4000 Å/500 Å respectively. The layer of the conductive material is patterned to form the first conductive connection lines 8 in the first through holes 21 and the third conductive connection lines 31 in the third through holes 23, and the second conductive connection lines 32 on the supporting components 6. The second conductive connection lines 32 are coupled to the touch signal lines 4 through the first conductive connection lines 8 and the f third conductive connection lines 31.

In step 4, a retaining wall 7 covering the plurality of first conductive connection lines 8 is formed. The retaining wall 7 is patterned to form second through holes exposing the second conductive connection lines 32.

As shown in FIG. 3, material of the retaining wall 7 is deposited on the base substrate after step 3 is completed. In some embodiments, the material of the retaining wall 7 is made of polyimide or photoresist. The material of the retaining wall 7 is patterned to form a pattern of the retaining wall. The retaining walls 7 and the supporting components constitute the pixel defining layer defining a plurality of sub-pixel regions. In addition, a second through hole is formed in each of the retaining walls. The second through holes can expose the corresponding second conductive connection lines 32. In some embodiments, the thickness of the pixel defining layer is approximately 15000 Å. A thickness of the supporting component is equal or larger than a maximum thickness of the retaining wall. That is, a thickness of the supporting component is at least about 7500 Å or higher. A thickness of the maximum thickness of the retaining wall is less than about 7500 Å. The supporting components 6 and the pixel defining layer 7 can constitute isolation spacers, which are used to support thick cells of the touch display apparatus.

In step 5, a plurality of isolation spacers with an inverted-table shape are formed (not shown in the figures).

A layer of negative photoresist is formed on the base substrate. The layer of negative photoresist is exposed. Since the exposed part of the negative photoresist is maintained, a plurality of isolated spacers with an inverted-table shape is formed after the developing process. The isolation spacers are configured to divide the cathodes into a plurality of sub-cathodes 14. The positions and the number of the spacers can be determined based on the positions and the number of the sub-cathodes 14. The isolation spacers are located between adjacent pixel areas, thereby not impacting the display of the touch display substrate. In one embodiment, the height of the isolation spacer is approximately 18000 Å.

In step 6, a shielding component 9 is used to shield the second through holes, and the material of a common layer is vapor deposited.

As shown in FIG. 4, the shielding component 9 is used to shield the second through holes. The material of the common layer and a material of an organic light-emitting layer are vapor deposited on the base substrate. The common layer includes a hole injection layer, a hole transport layer, an electron blocking layer 11, an electron transport layer, and an electron injection layer 13. The material of the organic light-emitting layer is vapor deposited between the hole injection layer/the hole transport layer 11 and the electron transport layer/the electron injection layer 13 to form the organic light-emitting layer 12.

Figure 9:
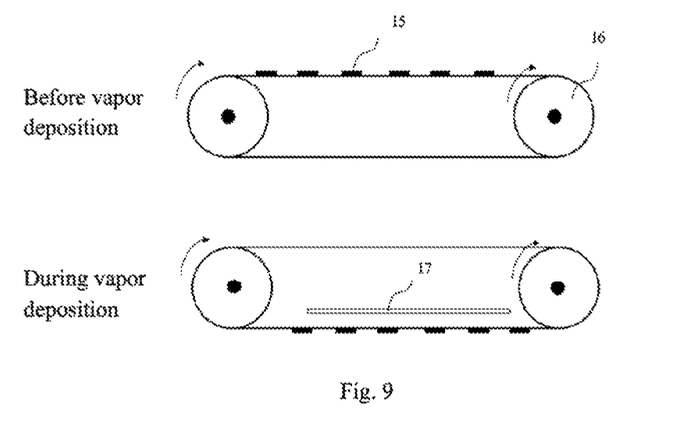
FIG. 9 is a schematic diagram of shielding a touch display substrate by a shielding component according to some embodiments of the present disclosure.

In one embodiment, the shielding component 9 includes metal blocking strips 15 as shown in FIG. 7 and FIG. 8. The metal strips 15 can constitute a grid structure. As shown in FIG. 9, the metal blocking strips 15 are controlled by a rail-rotating apparatus 16. The metal blocking strips 15 do not shield the base substrate before the vapor deposition. When the vapor deposition is carried out, the rail-rotating apparatus 16 is rotated so that the metal blocking strips 15 shield the base substrate. That is, the second through holes on the base substrate are shielded, and the metal blocking strips 15 can completely shield the plurality of the second through holes respectively.

In one embodiment, during vapor deposition, a hole injection layer with a thickness of approximately 50 Å is first vapor deposited. Then, a common layer of hole transmission layers with a thickness of approximately 140 Å is vapor deposited. Then, a hole transmission layer with a thickness of approximately 730 Å corresponding to a red light-emitting unit is vapor deposited. Then, a hole transmission layer with a thickness of approximately 400 Å corresponding to a green light-emitting unit is vapor deposited. Then, an electron blocking layer with a thickness of approximately 100 Å is vapor deposited. Then, an organic light-emitting layer with a thickness of approximately 230 Å corresponding to a blue light-emitting unit is vapor deposited. Then, an organic light-emitting layer with a thickness of approximately 200 Å corresponding to a green light-emitting unit is vapor deposited. Then, an organic light-emitting layer with a thickness of approximately 400 Å corresponding to a red light-emitting unit is vapor deposited. Then, an electron transport layer with a thickness of approximately 300 Å is vapor deposited. Then, an electron injection layer is vapor deposited. During the vapor deposition, since the second through holes are shielded by the metal blocking strips 15, the vapor deposited material doesn't fall into the second through holes.

In step 7, after the vapor deposition of the material of the common layer is completed, the shielding component is removed. Accordingly, the common layer formed includes a plurality of fourth through holes corresponding to the second through holes respectively. That is, the fourth through holes are connected to the second through holes.

As shown in FIG. 5, after the shielding component 9 is removed, the common layer naturally includes the fourth through holes. A second through hole and a fourth through hole form a through hole structure exposing a underlying second conductive connection line 32.

In step 7, a layer of cathode material is vapor deposited on a whole surface of the base substrate, and a plurality of mutually independent sub-cathodes 14 is formed. Furthermore, a plurality of fourth conductive connection lines 33 is formed in the fourth through holes and the second through holes.

Since the isolation spacers are of an inverted-table shape, the layer of the cathode material is naturally broken at the edges of the isolation spacers to form a plurality of sub-cathodes 14 which are insulated from each other. In the present embodiments, the sub-cathodes are also commonly used as the touch electrodes. Therefore, an embedded touch display apparatus can be realized. Furthermore, the structure of the touch display apparatus is simplified.

Figure 6:
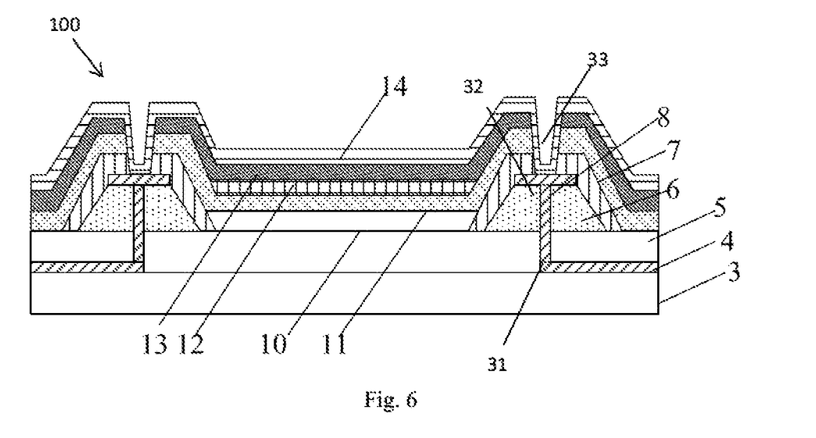

As shown in FIG. 6, the sub-cathodes are electrically coupled to the touch signal lines 4 through the through hole structures.

According to the embodiments of the present disclosure, the patterning of the cathodes is realized so that the cathodes can be commonly used as the touch electrodes. In addition, electrical connection of the cathodes and the touch signal lines is realized in the display area. As such, a uniform design of the touch electrodes is guaranteed, and the touch precision is effectively improved. Furthermore, there is no need to reserve a peripheral wiring area at the periphery of the display area, thereby facilitating realization of a narrow frame and a large size of the touch display apparatus.

A touch display substrate is provided according to some embodiments of the present disclosure. As shown in FIGS. 4-6, a display substrate, in a display area 100, include a first electrode layer 10 on a base substrate 3, a second electrode layer 14 on a side of the first electrode layer 10 far away from the base substrate 3, a light emitting layer 12 between the first electrode layer 10 and the second electrode layer 14, a pixel definition layer 67 defining a plurality of sub-pixel regions with each of the plurality of sub-pixel regions containing the light emitting layer and the first electrode layer, and a signal line 4 coupled to the second electrode layer 14. The signal line 4 is substantially or completely within the display area and at a different layer from the second electrode layer. The term "substantially" herein means that at least about 90% of the signal line, preferably about 95% of the signal line is within the display area.

In one embodiment, the display substrate further includes a conductive connection line in the display area, wherein the signal line is coupled to the second electrode layer through the conductive connection line.

In one embodiment, the pixel definition layer comprises a support component and a retaining wall. The support component comprises a first through hole and the retaining wall comprises a second through hole. A thickness of the support component is equal to or larger than a maximum thickness of the retaining wall.

In one embodiment, the display substrate further includes a planarization layer between the base substrate and the pixel definition layer, wherein the planarization layer comprises a third through hole, the third through hole being connected to the first through hole.

In one embodiment, the conductive connection line comprises a first conductive connection line, a second conductive connection line, and a third conductive connection line. The first conductive connection line is within the first through hole. The second conductive connection line is on the support component and contacts with the first conductive connection line. The third conductive connection line is within the third through hole. The second conductive connection line is coupled to the signal line through the first conductive connection line and the third conductive connection line.

In one embodiment, the display substrate further includes a fourth through hole formed in at least one of the light emitting layer or the second electrode layer. The fourth through hole is connected to the second through hole to expose a surface of the underlying second conductive connection line away from the base substrate. The conductive connection line further comprises a fourth conductive connection line within the fourth through hole and the second through hole, and the second electrode layer couples with the second conductive connection line through the fourth conductive connection line.

In one embodiment, the second electrode layer comprises a plurality of mutually spaced apart touch electrodes. The display substrate comprises a plurality of signal lines and a plurality of conductive connection lines, and the plurality of signal lines are respectively coupled to the corresponding touch electrodes through the plurality of conductive connection lines in the display area.

In one embodiment, the second electrode layer is a cathode layer and the first electrode layer is an anode layer.

In some embodiments, the touch display substrate includes a plurality of isolation spacers of an inverted-table shape. As such, when a layer of the cathode material is vapor deposited on the whole surface of the base substrate with the isolation spacers of the inverted-table shape, the part of the layer of the cathode material located on the spacers is separated from the other part of the layer of the cathode material. The layer of the cathode material is broken at the edges of the isolation spacers to form a plurality of sub-cathodes 14, which are insulated from each other. As such, the cathode is divided into a plurality of sub-cathodes 14, which are insulated from each other, through the isolation spacers.

In some embodiments, a pixel defining layer (6,7) is arranged between the touch electrodes 1 and the touch signal lines 4. The pixel defining layer (6,7) includes a plurality of supporting components 6 and a plurality of retaining walls 7 which define pixel areas. A second through hole is arranged in a retaining wall. The conductive connection line is located in the second through hole. Since the retaining walls are located between the adjacent anodes 10, the second through holes do not need to penetrate through the anodes, thereby not impacting the display of the touch display substrate.

In some embodiments, the extension directions of all touch signal lines are the same. In some embodiments, the extension directions of the touch signal lines are the same as the extension directions of data lines of the touch display apparatus.

In some embodiments, the touch signal line 4 adopts a three-layer structure of Ti/A/Ti. As such, the resistivity of the touch signal line 4 is very small and the voltage drop of touch signals transmitted on the touch signal line 4 is very small. As such, the load of the touch electrode is reduced to the maximum extent, thereby facilitating improvement of touch precision.

A display panel is provided according to some embodiments of the present disclosure. The display panel includes the touch display substrate as mentioned above.

A display apparatus is provided according to some embodiments of the present disclosure. The display apparatus includes the touch display substrate as mentioned above. The display apparatus can be a television, a display, a digital photo frame, a mobile phone, a tablet personal computer, or other products or parts with a display function. The display apparatus can further include a flexible circuit board, a printed circuit board, and a back plate.

The principles and the embodiments of the disclosures are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:

1. A display substrate having a display area, comprising:
a first electrode layer on a base substrate;
a second electrode layer on a side of the first electrode layer far away from the base substrate;
a light emitting layer between the first electrode layer and the second electrode layer;
a pixel definition layer defining a plurality of sub-pixel regions with each of the plurality of sub-pixel regions containing the light emitting layer and the first electrode layer; and
a signal line coupled to the second electrode layer;
wherein the signal line is substantially within the display area and at a different layer from the second electrode layer;
the pixel definition layer comprises a support component and a retaining wall;
the support component comprises a first through hole; and the retaining wall comprises a second through hole.

2. The display substrate according to claim 1, further comprising a conductive connection line in the display area, wherein the signal line is coupled to the second electrode layer through the conductive connection line.

3. The display substrate according to claim 2, wherein:
the second electrode layer comprises a plurality of mutually spaced apart touch electrodes;
the display substrate comprises a plurality of signal lines and a plurality of conductive connection lines, and the plurality of signal lines are respectively coupled to the corresponding touch electrodes through the plurality of conductive connection lines in the display area.

4. The display substrate according to claim 3, wherein the second electrode layer is a cathode layer and the first electrode layer is an anode layer.

5. The display substrate according to claim 1, wherein a thickness of the support component is equal to or larger than a maximum thickness of the retaining wall.

6. The display substrate according to claim 1, further comprising a planarization layer between the base substrate and the pixel definition layer, wherein the planarization layer comprises a third through hole, the third through hole being connected to the first through hole.

7. The display substrate according to claim 6, wherein:
the conductive connection line comprises a first conductive connection line, a second conductive connection line, and a third conductive connection line;
the first conductive connection line is within the first through hole;
the second conductive connection line is on the support component and contacts with the first conductive connection line, and
the third conductive connection line is within the third through hole,
wherein the second conductive connection line is coupled to the signal line through the first conductive connection line and the third conductive connection line.

8. The display substrate according to claim 6, wherein:
a fourth through hole is formed in at least one of the light emitting layer or the second electrode layer, the fourth through hole being connected to the second through hole to expose a surface of the second conductive connection line away from the base substrate, and
the conductive connection line further comprises a fourth conductive connection line within the fourth through hole and the second through hole, and the second electrode layer couples with the second conductive connection line through the fourth conductive connection line.

9. The display substrate according to claim 1, wherein the signal line is completely within the display area.

10. A display panel, comprising the display substrate according to claim 1.

11. A method of fabricating a display substrate having a display area, comprising:
forming a signal line substantially or completely within the display area on the base substrate;
forming a pixel definition layer defining a plurality of sub-pixel regions;
forming a first electrode layer in the plurality of sub-pixels region;
forming a light emitting layer on the first electrode layer; and
forming a second electrode layer on the light emitting layer;
wherein the second electrode layer is coupled to the signal line.

12. The method according to claim 11, between forming the signal line and forming the pixel definition layer, further comprising forming a planarization layer covering the signal line between the base substrate and the pixel definition layer.

13. The method according to claim 12, wherein forming the pixel definition layer comprises:
forming a support component on the planarization layer;
forming a first through hole in the support component and a third through hole in the planarization layer; the first through hole being connected with the third through hole; and
forming a first conductive connection line and a third conductive connection line in the first through hole and the third through hole respectively.

14. The method according to claim 13, wherein forming the pixel definition layer further comprises:
forming a second conductive connection line on the support component; the second conductive connection line being connected with the first conductive connection line.

15. The method according to claim 14, wherein forming the pixel definition layer further comprises:
forming a retaining wall on the support component;
forming a second through hole in the retaining wall, the second through hole exposing the underlying second conductive connection line;
applying a shielding component on the retaining wall to shield the second through hole;
wherein the second conductive connection line is coupled to the signal line through the first conductive connection line and the third conductive connection line.

16. The method according to claim 15, after forming the second electrode layer, further comprising:
removing the shielding component to form a fourth through hole in at least one of the light emitting layer or the second electrode layer, the fourth through hole being connected with the second through hole to expose a surface of the underlying second conductive connection line; and
forming the fourth connection line in the fourth through hole and the second through hole;

wherein the second electrode layer is coupled to the signal line through the fourth conductive connection line, the second conductive connection line, the first conductive connection line, and the third conductive connection line.

17. The method of claim 15, wherein applying the shielding component to shield the second through hole comprises:
moving the shielding component with a rail-rotating apparatus to shield the second through hole.

18. The method of claim 17, wherein the shielding component comprises a metal blocking strip having a grid structure.

19. A display apparatus, comprising the display panel according to claim 10.

* * * * *